United States Patent [19]

Black

[11] Patent Number: 5,859,567
[45] Date of Patent: Jan. 12, 1999

[54] POWER AMPLIFIER CIRCUIT WITH TEMPERATURE COMPENSATING LEVEL SHIFTER

[75] Inventor: Gregory Redmond Black, Vernon Hills, Ill.

[73] Assignee: Motorola, Inc., Schaumburg, Ill.

[21] Appl. No.: 710,888

[22] Filed: Sep. 24, 1996

[51] Int. Cl.[6] .................................................. H03G 3/30
[52] U.S. Cl. ......................... 330/279; 330/289; 455/126; 455/127
[58] Field of Search .................................. 330/129, 279, 330/289; 455/126, 127

[56] References Cited

U.S. PATENT DOCUMENTS

| | | | |
|---|---|---|---|
| 5,081,713 | 1/1992 | Miyazaki | 455/126 X |
| 5,150,075 | 9/1992 | Hietala et al. | |
| 5,160,898 | 11/1992 | Black. | |
| 5,220,290 | 6/1993 | Black. | |
| 5,363,057 | 11/1994 | Furuno | 330/289 X |
| 5,363,058 | 11/1994 | Sasaki. | |
| 5,373,250 | 12/1994 | Gatti et al. | |
| 5,408,697 | 4/1995 | Price et al. | 455/239.1 |
| 5,426,641 | 6/1995 | Afrashteh et al. | |
| 5,432,473 | 7/1995 | Mattila et al. | |
| 5,471,654 | 11/1995 | Okazaki et al. | 330/289 X |
| 5,506,544 | 4/1996 | Staudinger et al. | 330/277 |
| 5,570,065 | 10/1996 | Eberhardt et al. | 330/289 X |

FOREIGN PATENT DOCUMENTS 2 154819  9/1985  United Kingdom.

OTHER PUBLICATIONS

U.S. Patent No. 5559471–Black, issued Sep. 24, 1996.

U.S. application No. 08/662551, Applicants: Reif et al., filed Jun. 13, 1996, "Voltage Bias And Temperature Compensation Circuit For Radio Frequency Power Amplifier".

*Primary Examiner*—James B. Mullins
*Attorney, Agent, or Firm*—Mark D. Patrick

[57] ABSTRACT

A power amplifier circuit (200) for amplifying a radio frequency (RF) signal received at an input (208) into an amplified RF signal at an output (210) includes a coupler circuit (222, 122), a second input (206), a power amplifier (218), and a level shifter (228). The coupler circuit (222, 122) is coupled to the output (210) to detect a level of the amplified RF signal. The second input (206) receives a control signal derived from the detected level. The power amplifier (218) includes a transistor (234/236) having a gate (238/240) coupled to the input (208) and a drain (242/244) coupled to the output (210). The level shifter (228) is coupled to the second input (206) and the gate (238/240) and, responsive to the control signal, supplies a biasing voltage (VGG) to the gate (238/240). The level shifter (228) includes circuitry (255) to minimize temperature sensitivity of the biasing voltage (VGG).

5 Claims, 2 Drawing Sheets

POWER AMPLIFIER CIRCUIT WITH TEMPERATURE COMPENSATING LEVEL SHIFTER

FIELD OF THE INVENTION

This invention relates generally to communication devices and more specifically to a power amplifier circuit employed by communication devices.

BACKGROUND OF THE INVENTION

Power amplifiers are used in a communication device, such as a radiotelephone, for amplifying radio frequency (RF) signals for transmission. One type of radiotelephone operates in the GSM (Group Special Mobile) radiotelephone system. In the GSM system, up to 8 radiotelephones simultaneously share a single channel on which to broadcast. Each of the radiotelephones is limited to transmitting RF signals during an allocated time slot of approximately 577 $\mu$s. The radiotelephone must quickly ramp up its power amplifier to the proper frequency, transmit the RF signals, and quickly ramp down the power amplifier within the 577 $\mu$s window. As a result, the output power of the power amplifier must be controlled with great accuracy to meet system requirements and not interfere with the other radiotelephones sharing the same channel. This control may be accomplished by employing a closed loop feedback structure, such as that disclosed in U.S. Pat. No. 5,150,075 by Hietala et al., entitled "Power Amplifier Ramp Up Method and Apparatus", issued on Sep. 22, 1992, and assigned to Motorola, Inc.

One widely used power amplifier comprises depletion mode transistors, such as gallium arsenide (GaAs) MESFET (metal-semiconductor field effect transistor) devices. GaAs MESFETs are beneficial because they exhibit comparatively high electron mobility and provide good performance across a wide frequency range. Because the GaAs MESFET is a depletion mode transistor, it requires application of a negative bias voltage to its gate for active mode biasing. The negative bias voltage is typically supplied by a level shifter coupled to the gate of the GaAs MESFET. Because the gate threshold voltage of a GaAs MESFET varies with changes in temperature, the level shifter must be adjustable to accordingly vary the negative bias voltage so as to maintain accurate control of the output power of the power amplifier. One such level shifter is disclosed in U.S. Pat. No. 5,559,471 by Black et al., entitled "An Amplifier and Biasing Circuit Therefore", issued on Sep. 24, 1996, and assigned to Motorola, Inc. In addition to being adjustable, it would further be desirable to minimize the temperature sensitivity of the level shifter itself to achieve additional accuracy in output power control.

Thus, what is needed is a level shifter for use in a power amplifier circuit for a communication device employing a closed loop feedback system that is not sensitive to temperature variations.

DETAILED DESCRIPTION OF THE PREFERRED EMBODIMENTS

Figure 1:
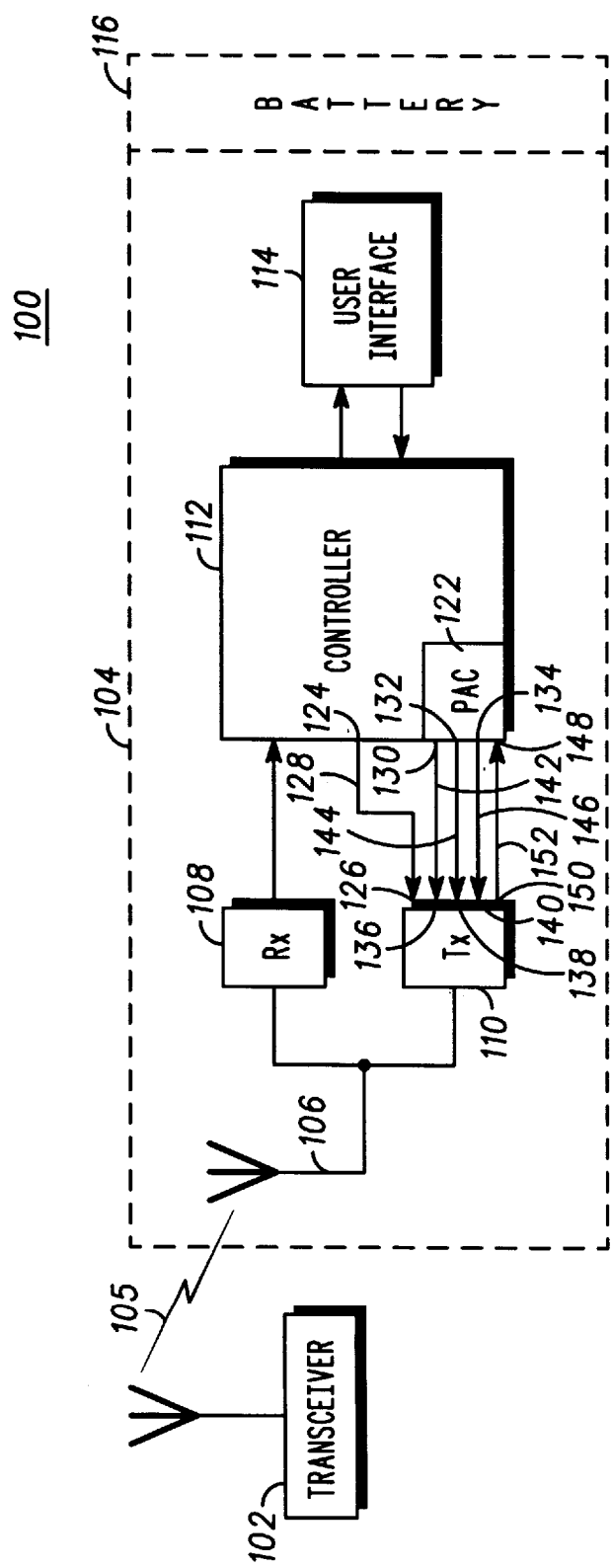
FIG. 1 is a block diagram illustrating a communication system including a communication device having a transmitter.

A power amplifier circuit for amplifying a radio frequency (RF) signal received at an input into an amplified RF signal at an output includes a coupler circuit, a second input, a power amplifier, and a level shifter. The coupler circuit is coupled to the output to detect a level of the amplified RF signal. The second input receives a control signal derived from the detected level. The power amplifier includes a transistor having a gate coupled to the input and a drain coupled to the output. The level shifter is coupled to the second input and the gate and, responsive to the control signal, supplies a biasing voltage to the gate. The level shifter includes circuitry to minimize temperature sensitivity of the biasing voltage. Unlike existing level shifters, the level shifter disclosed hereinbelow compensates for temperature variations in a power amplifier circuit employing gate control and closed loop feedback.

A communication system, such as a radiotelephone communication system 100, includes a first communication device, such as a remote transceiver 102 and a second communication device, such as a radiotelephone 104. The remote transceiver 102 sends and receives radio frequency (RF) signals 105 to and from communication devices within a fixed geographic area. The radiotelephone 104 is one such communication device contained within the geographic area. The radiotelephone 104 includes an antenna 106, a receiver 108, a transmitter 110, a controller 112, a user interface 114, and a battery 116. The battery 116 provides electrical power for operating the radiotelephone 104.

Upon reception, the antenna 106 transduces the RF signals 105 into electrical receive signals and couples the electrical receive signals to the receiver 108. The receiver 108 converts the electrical receive signals into electrical baseband signals, demodulates and decodes the electrical baseband signals to recover the data transmitted on the RF signals 105, and provides the data to the controller 112. The controller 112 formats the data into recognizable voice or information for use by the user interface 114. The user interface 114 communicates the received information or voice to a user. Typically, the user interface includes a display, a keypad, a speaker and a microphone.

Upon transmission of the RF signals 105 from the radiotelephone 104 to the remote transceiver 102, the user interface 114 transmits user input data to the controller 112. The controller 112 formats the user input data obtained from the user interface 114 into encoded baseband signals and sends the encoded baseband signals to the transmitter 110 for conversion into RF modulated signals and amplification. The transmitter 110 couples the amplified RF modulated signals to the antenna 106 for transduction and emission to the remote transceiver 102 as the RF signals 105.

The controller 112 includes an output 124 for providing the encoded baseband signals to an input 126 of the transmitter 110 via line 128 for modulation. The controller 112 includes a power amplifier control (PAC) circuit 122. The PAC circuit 122 has outputs 130, 132, and 134 for supplying a main supply control signal, an enable signal having a voltage level VEN, and a bias control signal having a voltage level VCN, respectively, to respective inputs 136, 138, and 140 of the transmitter 110 via respective lines 142, 144, and 146. The PAC circuit 122 includes an input 148 for receiving a power level of amplified modulated RF signals output by the transmitter 110 and fed back via output 150 of the transmitter 110 and line 152. Upon detection of the fed back power level, the PAC circuit 122 sets the voltage level VCN of the bias control signal. In the illustrated embodiment, the voltage level VEN is approximately 3 V and the voltage level VCN is controllable over a range of approximately 0 V to 2 V. Other suitable voltage levels and ranges may be selected. The radiotelephone 104 includes other control connections coupling the controller 112 to other operational elements of the radiotelephone 104. However, these connections are not illustrated in FIG. 1 so as to not unduly complicate the drawing figure.

Figure 2:
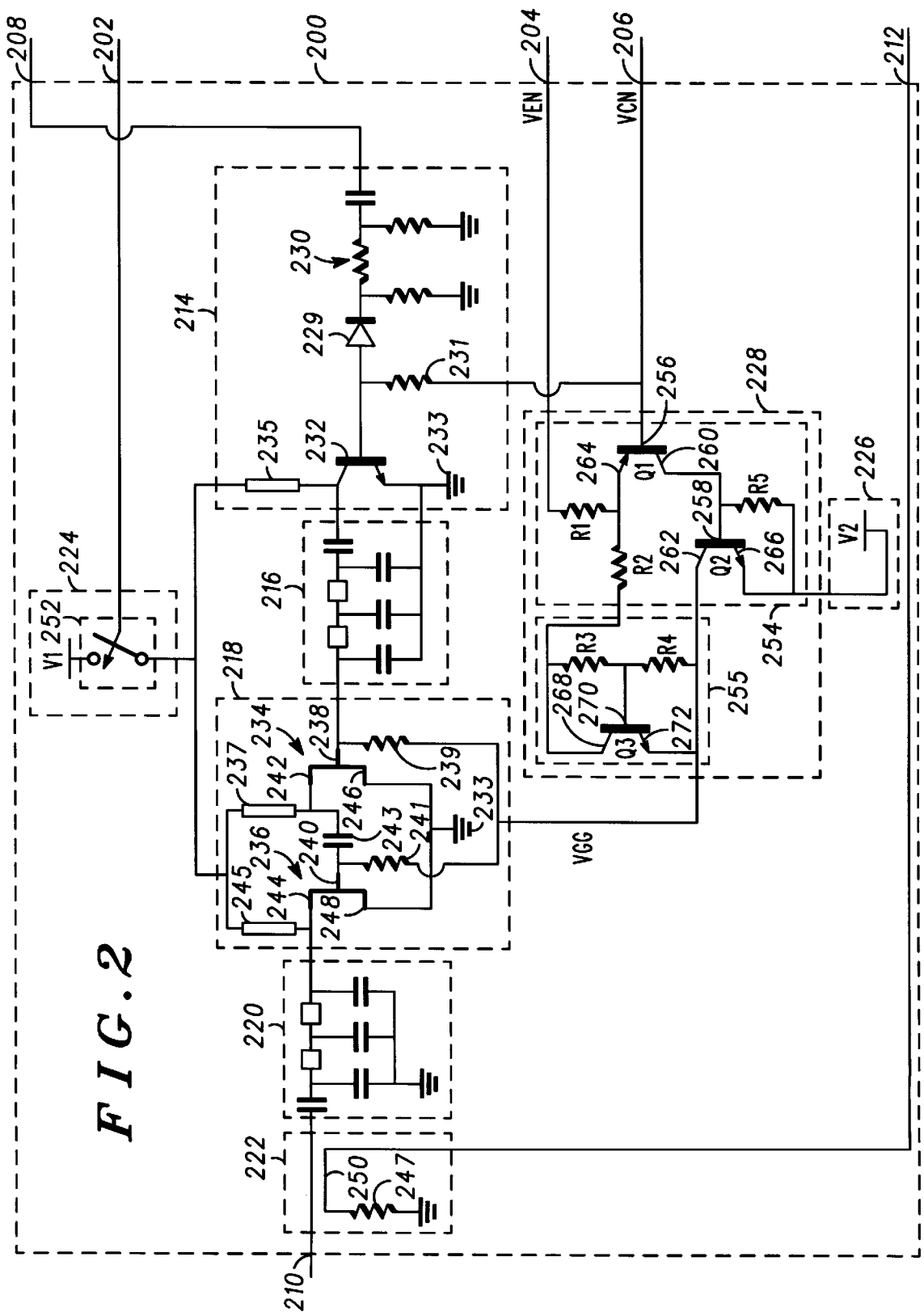
FIG. 2 is a schematic diagram illustrating a power amplifier circuit for use in the transmitter of FIG. 1.

Referring now to FIG. 2, a power amplifier circuit 200 included in the transmitter 110 (FIG. 1) includes inputs 202, 204, 206, and 208 and outputs 210 and 212. The inputs 202, 204, and 206 are coupled to inputs 136 (FIG. 1), 138, 140, respectively, of the transmitter 110 to receive the main supply control signal, the voltage level VEN of the enable signal, and the voltage level VCN of the bias control signal, respectively. The input 208 (FIG. 2) is coupled to receive modulated RF signals derived from the encoded baseband signals originally received at input 126 (FIG. 1) of the transmitter 110. The output 210 delivers an amplified modulated RF signal suitable for transmission by the antenna 106 (FIG. 1). The output 212 (FIG. 2) is coupled to output 150 (FIG. 1) of the transmitter 110 to deliver a fed back power level of the amplified modulated RF signal to the PAC circuit 122 of the controller 112.

The power amplifier circuit 200 comprises an exciter 214, a first impedance matching circuit 216, a power amplifier 218, a second impedance matching circuit 220, a coupler 222, a main voltage supply 224, a biasing voltage supply 226, and a level shifter 228. The exciter 214 adjusts modulated RF signals at input 208 to their proper input level for the power amplifier 218 and couples the adjusted modulated RF signals to the first impedance matching circuit 216. The exciter 214 includes a transistor 232 having a base terminal coupled to input 208, via an attenuator comprised of an RF switching diode 229 and a resistive Pi network 230, to receive the modulated RF signals, and to input 206 via a resistor 231. A collector terminal of the transistor 232 is coupled to the main voltage supply 224 via an inductive element 235 and the first impedance matching circuit 216. An emitter terminal of the transistor 232 is coupled to an electrical ground 233. The amplification level of the transistor 232 necessary to adjust the modulated RF signals is set by a bias current derived from the resistor 231 and the voltage level VCN of the bias control signal received via the input 206. In the illustrated embodiment, the transistor 232 is any suitable npn bipolar junction transistor (BJT) having base to emitter voltage level (VBE) of approximately 0.7 V and a temperature sensitivity of approximately −2 mV/°C. The exciter 214 may be that described in U.S. Pat. Nos. 5,160,898 and 5,220,290 by Black, entitled "Power Amplifier", issued on Nov. 3, 1992 and Jun. 15, 1993, respectively, and assigned to Motorola, Inc.

The first impedance matching circuit 216 couples the modulated RF signals adjusted by the exciter 214 to the power amplifier 218. The first impedance matching circuit 216 is coupled to the collector terminal of the transistor 232 of the exciter 214 and provides low-loss radio frequency impedance matching between the exciter 214 and the power amplifier 218. The design of the first impedance matching circuit 216 is accomplished by one ordinarily skilled in the art.

The power amplifier 218 amplifies the modulated RF signals provided by the first impedance matching circuit 216 and couples the amplified modulated RF signals to the second impedance matching circuit 216. The power amplifier 218 is a multi-stage amplifier including a first stage comprising a first transistor 234 and a second stage, cascaded with the first stage, comprising a second transistor 236. The first and second transistors 234 and 236 include respective gate terminals 238 and 240, respective drain terminals 242 and 244, and respective source terminals 246 and 248. As for the first transistor 234, gate terminal 238 is coupled to the first impedance matching circuit 216 and the level shifter 228 via a resistor 239; drain terminal 242 is coupled to the main voltage supply 224 via an inductive element 237 and to gate terminal 240 of the second transistor 236 via a capacitor 243; and source terminal 246 is coupled to electrical ground 233. As for the second transistor 236, gate terminal 240 is further coupled to the level shifter 228 via a resistor 241; drain terminal 244 is coupled to the main voltage supply 224 via an inductive element 245 and to the second impedance matching circuit 220; and source terminal 248 is coupled to electrical ground 233. The level at which the first and second transistors 234 and 236 amplify the modulated RF signals is set by bias currents responsive to voltages at the gate terminals 238 and 240, respectively, derived from the resistors 239 and 241 and a voltage level VGG of a biasing voltage supplied by the level shifter 228. In the illustrated embodiment, transistors 234 and 236 are any suitable depletion mode transistors, such as GaAs MESFETs or GaAs pHEMTs (psuedo-morphic high electron mobility transistors), having a temperature sensitivity ranging from approximately −4 mV/°C. to approximately 4 mV/°C.

The second impedance matching circuit 220 couples the modulated RF signals amplified by the power amplifier 218 to output 210. The second impedance matching circuit 220 is coupled to the drain terminal 244 of the second transistor 236 of the power amplifier 218 and provides low-loss radio frequency impedance matching between the power amplifier 218 and circuitry connected to the output 210. The design of the second impedance matching circuit 220 is accomplished by one ordinarily skilled in the art.

The coupler 222 couples power levels of the amplified modulated RF signals to output 212. The coupler 222 includes a directional coupler 250 comprising an electromagnetic coupler which couples without excessive loss. The coupler 222 includes a resistor 247 for directing the coupled power level to output 212.

The main voltage supply 224 selectively supplies power to the transistor 232 of the exciter 214 and the transistors 234 and 236 of the power amplifier 218. The main voltage supply 224 comprises a voltage supply V1 provided by the battery 116 (FIG. 1) and a controllable switch 252 (FIG. 2) having terminals coupled between the voltage supply V1 and both the exciter 214 and the power amplifier 218. The controllable switch 252 includes a control port coupled to input 202. The controllable switch 252, responsive to the main supply control signal received at the control port, closes to connect or opens to disconnect the voltage supply V1 to or from the exciter 214 and the power amplifier 218. To prevent the voltage supply V1 from shorting to ground through the transistors 232, 234, or 236 and potentially damaging transistors 232, 234, or 236 or the main voltage supply 224, the controller 112 (FIG. 1) supplies the bias control signal prior to closing the controllable switch 252 (FIG. 2) via the main supply control signal so as to ensure the transistors 232, 234, and 236 are biased before application of the voltage supply V1 thereto.

The biasing voltage supply 226 supplies voltage for biasing the transistors 234 and 236 of the power amplifier 218. The biasing voltage supply 226 includes a voltage supply V2 derived from a regulator circuit (not shown) powered by the battery 116 (FIG. 1). The voltage supply V2 is coupled to the level shifter 228. In the illustrated embodiment, the transistors 234 and 236 are depletion mode and, thus, the voltage supply V2 is a negative voltage, such as −10 V.

The level shifter 228, responsive to PAC circuit 122 (FIG. 1), outputs the voltage level VGG of the biasing voltage to control the amplification level of the transistors 234 and 236 of the power amplifier 218. The level shifter 228 includes a feedback circuit 254 and a temperature compensating circuit 255.

The feedback circuit 254 comprises transistors Q1 and Q2 and resistors R1, R2, and R5. The transistors Q1 and Q2 include respective base terminals 256 and 258, respective collector terminals 260 and 262, and respective emitter terminals 264 and 266. As for the transistor Q1, the base terminal 256 is coupled to the input 206 of the power amplifier circuit 200 to receive the voltage level VCN of the bias control signal; the collector terminal 260 is coupled to the base terminal 258 of the transistor Q2 and to one end of the resistor R5; and the emitter terminal 264 is coupled to one end of the resistor R1 and to one end of the resistor R2. The other end of the resistor R1 is coupled to the input 204 to receive the voltage level VEN of the enable signal. The other end of the resistor R2 is coupled to the gate terminals 238 and 240 of the transistors 234 and 236, respectively, of the power amplifier 218 via the temperature compensating circuit 255. As for the transistor Q2, the collector terminal 262 is coupled to the gate terminals 238 and 240 of the transistors 234 and 236, respectively, of the power amplifier 218 via the temperature compensating circuit 255; and the emitter terminal 266 is coupled to the voltage supply V2 of the biasing voltage supply 226 and to the other end of the resistor R5. In the illustrated embodiment, the transistors Q1 and Q2 are any suitable pnp and npn BJTs, respectively, each having a VBE of approximately 0.7 V and a temperature sensitivity of approximately $-2$ mV/°C.

For illustrative purposes, assume that the temperature compensating circuit 255 is absent from the level shifter 228 and the other end of the resistor R2 and the collector terminal 262 of the transistor Q2 are coupled directly to the gate terminals 238 and 240 of the transistors 234 and 236, respectively, of the power amplifier 218 to provide the voltage level VGG of the biasing voltage thereto. The feedback circuit 254 operates to feed back the current at the collector terminal 262 of the transistor Q2 through the resistor R2 to the emitter terminal 264 of the transistor Q1. The voltage level VEN of the enable signal is sufficient to force a current IR1 through the resistor R1 to be equal to a current IR2 through resistor R2. The resistor R5 is sufficiently large to sink current when the voltage on the base terminal 258 of the transistor Q2 is moving more negative. Further assuming VBEQ1 defines a VBE of the transistor Q1, the voltage level VGG of the biasing voltage supplied by the feedback circuit 254 is calculated as follows:

$$IR1=IR2 \text{ (VEN-VCN-VBEQ1)}/R1=(VCN+VBEQ1-VGG)/R2$$

$$VGG=((R2+R1)/R1)*VCN+((R2+R1)*VBEQ1-(R2/R1)*VEN.$$

The temperature sensitivity of the voltage level VGG of the biasing voltage supplied by the feedback circuit 254 is as follows:

$$\begin{aligned}\partial/\partial T(VGG) &= ((R2+R1)/R1) * \partial/\partial T(VBEQ1) \\ &= ((R2+R1)/R1) * (-2mV/°C).\end{aligned} \quad (1)$$

Setting the resistors R1 and R2 to acceptable values, such as 1 kΩ and 2 kΩ, respectively, the temperature sensitivity of the voltage level VGG of the biasing voltage becomes:

$$\partial/\partial T[VGG]=-6 \text{ mV/°C}.$$

Over a range of acceptable values for the resistors R1 and R2, the temperature sensitivity of the voltage level VGG of the biasing voltage supplied by the feedback circuit 254 varies between $-5$ mV/°C. and $-10$ mV/°C. during typical operation of the power amplifier circuit 200. Over a temperature range of $-30°$ to $+70°$ C., the voltage level VGG of the biasing voltage varies from 0.5 V to 1 V. Such a high degree of variation of the voltage level VGG makes it difficult to simultaneously bias the exciter 214 and the power amplifier 218 so that the required output power and efficiency of the amplified modulated RF signals is maintained over temperature and component variations.

To minimize temperature variations in the voltage level VGG of the biasing voltage, the level shifter 228 includes the temperature compensating circuit 255. The temperature compensating circuit 255 includes a transistor Q3 and resistors R3 and R4 arranged in a VBE Multiplier configuration and added in series with the resistor R2 of the feedback circuit 254. The transistor Q3 includes a collector terminal 268 coupled to the other end of the resistor R2 and one end of the resistor R3; a base terminal 270 coupled to the other end of the resistor R3 and one end of the resistor R4; and an emitter terminal 272 coupled to the collector terminal 262 of the transistor Q2, the other end of the resistor R4, and the gate terminals 238 and 240 of the transistors 234 and 236, respectively, of the power amplifier 218. A VBE of the transistor Q3 is defined as VBEQ3. The voltage across, and the current through, the resistor R3 is defined as VR3 and IR3, respectively. The voltage across, and the current through, the resistor R4 is defined as VR4 and IR4, respectively. In the illustrated embodiment, the transistor Q3 is any suitable npn BJT having a VBE of approximately 0.7 V and a temperature sensitivity of approximately $-2$ mV/°C.

Assuming no current flows into the base terminal 270 of the transistor Q3, a voltage level VTC attributable to the temperature compensating circuit 255 is determined as follows:

$$\begin{aligned}VTC &= VR3+VR4 \\ &= IR3 * R3 + VBEQ3 \\ &= IR4 * R3 + VBEQ3 \\ &= (VBEQ3/R4) * R3 + VBEQ3 \\ &= ((R3+R4)/R4) * VBEQ3.\end{aligned}$$

Again assuming that the current IR1 through the resistor R1 is equal to the current IR2 through resistor R2, the voltage level VGG of the biasing voltage supplied by the feedback circuit 254 in conjunction with the temperature compensating circuit 255 is calculated as follows:

$$IR1=IR2 \text{ (VEN-VCN-VBEQ1)}/R1=(VCN+VBEQ1-VTC-VGG)/R2$$

$$VGG=((R2+R1)/R1)*VCN+((R2+R1)/R1)*VBEQ1-((R3+R4)/R4)*VBEQ3-(R2/R1)*VEN$$

The temperature sensitivity of the voltage level VGG of the biasing voltage supplied by the feedback circuit 254 in conjunction with the temperature compensating circuit 255 is as follows:

$$\begin{aligned}\partial/\partial T(VGG) &= ((R2+R1)/R1) * \partial/\partial T(VBEQ1) - \\ &\quad ((R3+R4)/R4) * \partial/\partial T(VBEQ3) \\ &= (((R2+R1)/R1) - \\ &\quad ((R3+R4)/R4))) * (-2mV/°C).\end{aligned} \quad (2)$$

The temperature sensitivity of the voltage level VGG of the biasing voltage can be set to zero by setting the resistors R1, R2, R3, and R4 in Equation (2) as follows:

$$(R2+R1)/R1=(R3+R4)/R4.$$

Assuming that the voltage level VGG is to remain constant while the voltage level VCN of the bias control signal from the PAC circuit 122 (FIG. 1) varies with the VBE of the transistor 232 of the exciter 214 (denoted VBEEX), the temperature sensitivity of the voltage level VGG is as follows:

$$\begin{aligned}\partial/\partial T(VGG) &= ((R2+R1)/R1) * \partial/\partial T(VBEQ1+VBEEX) - \quad (3)\\ &\quad ((R3+R4)/R3] * \partial/\partial T(VBEQ3)\\ &= ((2*(R2+R1)/R1) -\\ &\quad ((R3+R4)/R3)) * (-2mV/°C).\end{aligned}$$

The temperature sensitivity of the voltage level VGG of the biasing voltage can be set to zero by setting the resistors R1, R2, R3, and R4 in Equation (3) as follows:

$$2*(R2+R1)/R1=(R3+R4)/R4.$$

Additionally, it can be assumed that the voltage level VGG is to vary over temperature such that it follows the variation of a transistor pinchoff voltage, a gate terminal voltage for peak output power, a gate terminal voltage for power or peak efficiency, or any other temperature dependent parameter relating to the gate terminal voltage. A desired variation of the gate terminal voltage over temperature is typically dependent on a gate doping profile of a depletion mode transistor, such as a GaAs MESFET or GaAs pHEMT, and may therefore be unique to a given supplier. Assume that optimum performance is obtained with a voltage level VGG having a temperature sensitivity of −4 mV/°C. while the voltage level VCN of the bias control signal is varying at −2 mV/°C. Also, assume that a desired gain of the level shifter 228 is 3, such that:

$$Gain=3=(R2+R1)/R1.$$

The resistors R1 and R2 are set to 1 kΩ and 2 kΩ, respectively, to satisfy this condition. The temperature sensitivity of the voltage level VGG of Equation (3) becomes:

$$\begin{aligned}\partial/\partial T(VGG) = (-4mV/°C) &= ((2*(R2+R1)/R1) -\\ &\quad ((R3+R4)/R3)) * (-2mV/°C)\\ &= ((2*3)-((R3+R4)/R3)) * (-2mV/°C)\\ &= (6-((R3+R4)/R3)) * (-2mV/°C)\end{aligned}$$

Setting the resistor R3 to 30 kΩ and the resistor R4 to 10 kΩ, the temperature sensitivity of the voltage level VGG becomes:

$$\begin{aligned}\partial/\partial T(VGG) = (-4mV/°C) &= (6-((R3+R4)/R3)) * (-2vV/°C)\\ &= (6-4)*(-2mV/°C)\\ &= -4mV/°C.\end{aligned}$$

Thus it can be seen that a temperature compensating level shifter can be provided for a power amplifier circuit employing a closed loop feedback system. The level shifter employs a VBE multiplier to minimize the temperature sensitivity of a biasing voltage applied to the gate of the transistors comprising a power amplifier of the power amplifier circuit. Although illustrated to include a npn transistor, one skilled in the art will recognize that the VBE Multiplier could alternatively comprise a pnp transistor. Use of a pnp transistor as the transistor Q3 would necessitate swapping positions of the resistors R3 and R4. The resistor R4 would be coupled between the base of the pnp transistor and both the emitter of the pnp transistor and the other end of the resistor R2. The resistor R3 would be coupled between the base of the pnp transistor and both the collector of the pnp transistor and the collector terminal 262 of the transistor Q2.

What is claimed is:

1. A power amplifier circuit for amplifying a radio frequency (RF) signal into an amplified RF signal, the power amplifier circuit comprising:

a biasing voltage supply;

a first input to receive the RF signal;

an output to provide the amplified RF signal;

a coupler circuit coupled to the output to detect a level of the amplified RF signal;

a second input to receive a control signal derived from the level;

a power amplifier comprising a first transistor, the first transistor having a gate and a drain, the gate coupled to the first input, and the drain coupled to the output; and a level shifter coupled to the second input and the gate, the level shifter, responsive to the control signal, supplying a biasing voltage to the gate to set an amplification level of the first transistor, the level shifter minimizing temperature sensitivity of the biasing voltage, the level shifter comprising a feedback circuit coupled to the second input, the biasing voltage supply, and the gate of the first transistor of the power amplifier, the feedback circuit comprising:

a third input to receive an enable voltage;

a second transistor having a base, a collector, and an emitter, the base of the second transistor coupled to the second input;

a third transistor having a base, a collector, and an emitter, the base of the third transistor coupled to the collector of the second transistor, the collector of the third transistor coupled to the gate of the first transistor of the power amplifier, the emitter of the third transistor coupled to the biasing voltage supply;

a first resistive element having two ends, one end of the first resistive element coupled to the third input and the other end of the first resistive element coupled to the emitter of the second transistor;

a second resistive element having two ends, one end of the second resistive element coupled to the emitter of the second transistor; and a third resistive element having two ends, one end of the third resistive element coupled to the base of the third transistor and the other end of the third resistive element coupled to the emitter of the third transistor.

2. The power amplifier circuit according to claim 1 wherein the level shifter comprises a temperature compensating circuit, the temperature compensating circuit comprising:

a fourth transistor having a base, an emitter, and a collector, the collector of the fourth transistor coupled to the other end of the second resistive element, the emitter of the fourth transistor coupled to the gate of the first transistor of the power amplifier;

a fourth resistive element having two ends, one end of the fourth resistive element coupled to the collector of the fourth transistor and the other end of the fourth resistive element coupled to the base of the fourth transistor; and a fifth resistive element having two ends, one end of the fifth resistive element coupled to the base of the fourth transistor and the other end of the fifth resistive element coupled to the gate of the first transistor of the power amplifier.

3. A power amplifier circuit for amplifying a radio frequency (RF) signal into an amplified RF signal, the power amplifier circuit comprising:

a first input to receive the RF signal;

an output to provide the amplified RF signal;

a coupler circuit coupled to the output to detect a level of the amplified RF signal;

a second input to receive a control signal derived from the level;

a power amplifier comprising a first transistor, the first transistor having a gate and a drain, the gate coupled to the first input, and the drain coupled to the output; and a level shifter coupled to the second input and the gate, the level shifter, responsive to the control signal, supplying a biasing voltage to the gate to set an amplification level of the first transistor, the level shifter minimizing temperature sensitivity of the biasing voltage, the level shifter comprising a temperature compensating circuit, the temperature compensating circuit comprising a VBE Multiplier.

4. A power amplifier circuit for amplifying a radio frequency (RF) signal into an amplified RF signal, the power amplifier circuit comprising:

a first input to receive the RF signal;

an output to provide the amplified RF signal;

a coupler circuit coupled to the output to detect a level of the amplified RF signal;

a second input to receive a control signal derived from the level;

a power amplifier comprising a first transistor, the first transistor having a gate and a drain, the gate coupled to the first input, and the drain coupled to the output; and a level shifter coupled to the second input and the gate, the level shifter, responsive to the control signal, supplying a biasing voltage to the gate to set an amplification level of the first transistor, the level shifter comprising a feedback circuit and a temperature compensating circuit, the temperature compensating circuit comprising:

a second transistor having a first terminal, a second terminal, and a third terminal, the first terminal coupled to the feedback circuit, the second terminal coupled to the feedback circuit and the gate of the first transistor of the power amplifier;

a first resistive element having two ends, one end of the first resistive element coupled to the first terminal and the feedback circuit, and the other end of the first resistive element coupled to the third terminal; and a second resistive element having two ends, one end of the second resistive element coupled to the third terminal and the other end of the second resistive element coupled to the second terminal and the gate of the first transistor of the power amplifier, the level shifter minimizing temperature sensitivity of the biasing voltage.

5. A communication device comprising:

an antenna;

a receiver coupled to the antenna to receive a radio frequency (RF) input signal therefrom;

a controller having a first input, a second input, a first output, and a second output, the first input coupled to the receiver to receive the RF input signal, the controller to format an RF output signal and couple the RF output signal to the first output, the controller, responsive to a presence of a level signal at the second input, generating a control signal and coupling the control signal to the second output; and a transmitter having a third input, a fourth input, a third output, and a fourth output, the third input coupled to the first output, the fourth input coupled to the second output, the third output coupled to the second input, the fourth output coupled to the antenna, the transmitter comprising a power amplifier coupled to the third input and the fourth output, a coupler coupled to the third output and the fourth output, and a level shifter coupled to the fourth input and the power amplifier, the power amplifier amplifying the RF output signal at the third input and providing an amplified RF output signal at the fourth output, the coupler coupling a level signal to the third output describing a level of the amplified RF output signal at the fourth output, and the level shifter, responsive to the control signal at the fourth input, supplying a temperature compensated biasing voltage to the power amplifier.

* * * * *